US009437796B2

(12) United States Patent
Venkatasubramanian et al.

(10) Patent No.: US 9,437,796 B2
(45) Date of Patent: Sep. 6, 2016

(54) RARE EARTH-DOPED MATERIALS WITH ENHANCED THERMOELECTRIC FIGURE OF MERIT

(71) Applicant: RESEARCH TRIANGLE INSTITUTE, Research Triangle Park, NC (US)

(72) Inventors: Rama Venkatasubramanian, Cary, NC (US); Bruce Allen Cook, Ankeny, IA (US); Evgenii M. Levin, Ames, IA (US); Joel Lee Harringa, Ames, IA (US)

(73) Assignees: RESEARCH TRIANGLE INSTITUTE, Research Triangle Park, NC (US); U.S. DEPARTMENT OF ENERGY, Washington, DC (US)

( * ) Notice: Subject to any disclaimer, the term of this patent is extended or adjusted under 35 U.S.C. 154(b) by 825 days.

(21) Appl. No.: 13/725,156

(22) Filed: Dec. 21, 2012

(65) Prior Publication Data
US 2013/0186449 A1    Jul. 25, 2013

Related U.S. Application Data

(63) Continuation of application No. PCT/US2011/051573, filed on Sep. 14, 2011.

(60) Provisional application No. 61/344,700, filed on Sep. 16, 2010.

(51) Int. Cl.
*H01L 35/14* (2006.01)
*H01L 35/16* (2006.01)
(Continued)

(52) U.S. Cl.
CPC ............... *H01L 35/16* (2013.01); *C22C 1/02* (2013.01); *C22C 28/00* (2013.01); *H01F 1/401* (2013.01)

(58) Field of Classification Search
CPC .............................. H01L 35/14; H01L 35/16
USPC .............................. 136/236.1, 238, 239, 241
See application file for complete search history.

(56) References Cited

U.S. PATENT DOCUMENTS

2006/0118158 A1    6/2006 Zhang et al.
2007/0095382 A1    5/2007 Snyder et al.
(Continued)

FOREIGN PATENT DOCUMENTS

CN    101740713 A    6/2010
JP    2007-258200    10/2007
(Continued)

OTHER PUBLICATIONS

Office Action issued in corresponding Japanese Patent Application No. 2013-529295 mailed Sep. 7, 2015 (with English translation).
Alekseeva, G.T. et al., Donorlike behavior of rare-earth impurities in PbTe, Semiconductors, 1998, vol. 32, No. 7, pp. 716-719.
(Continued)

*Primary Examiner* — Susan D Leong
(74) *Attorney, Agent, or Firm* — Oblon, McClelland, Maier & Neustadt, L.L.P.

(57) ABSTRACT

A thermoelectric material and a thermoelectric converter using this material. The thermoelectric material has a first component including a semiconductor material and a second component including a rare earth material included in the first component to thereby increase a figure of merit of a composite of the semiconductor material and the rare earth material relative to a figure of merit of the semiconductor material. The thermoelectric converter has a p-type thermoelectric material and a n-type thermoelectric material. At least one of the p-type thermoelectric material and the n-type thermoelectric material includes a rare earth material in at least one of the p-type thermoelectric material or the n-type thermoelectric material.

29 Claims, 10 Drawing Sheets

(51) Int. Cl.
*C22C 1/02* (2006.01)
*C22C 28/00* (2006.01)
*H01F 1/40* (2006.01)

(56) References Cited

U.S. PATENT DOCUMENTS

2009/0095938 A1 4/2009 Hasegawa et al.
2010/0071741 A1 3/2010 Yang et al.

FOREIGN PATENT DOCUMENTS

JP 2008-523614 7/2008
WO WO 2006/062582 A2 6/2006

OTHER PUBLICATIONS

Ahn, K. et al., Improvement in the Thermoelectric Figure of Merit by La/Ag Cosubstitution in PbTe, Chemistry of Materials, 2009, vol. 21, Issue 7, pp. 1361-1367.

Alidjanov, M.A. et al., "Termoeletricheskie svoystva tverdih rastvorov (GeTe)1-x(Sm2Te3)x pri visokih temperaturah," Izvestiya Akademii Naukk SSSR. Neorganicheskie Materialy, 1991, vol. 27, No. 1, pp. 155-157.

Shelimova, L. E. et al., "Phiziko-himicheskoye issledovaniye tverdih rastvorov na osnove tellurida germaniya v sisteme Ge-Te-La," Neorganicheskie Materialy, 1991, vol. 27, No. 11, pp. 2285-2289.

Combined Office Action and Search Report issued Mar. 12, 2015 in Chinese Patent Application No. 201180044392.6 (with English language translation).

RARE EARTH-DOPED MATERIALS WITH ENHANCED THERMOELECTRIC FIGURE OF MERIT

CROSS REFERENCE TO RELATED APPLICATIONS

This application is related to and claims priority under 35 U.S.C. 119(e) to U.S. application Ser. No. 61/344,700, filed Sep. 16, 2010, entitled "CE- AND YB-DOPED TAGS-85 MATERIALS WITH ENHANCED THERMOELECTRIC FIGURE OF MERIT," the entire contents of which are incorporated herein by reference.

STATEMENT REGARDING FEDERALLY SPONSORED RESEARCH OR DEVELOPMENT

This application is a continuation application of PCT Application No. PCT/US2011/051573, filed Sep. 14, 2011, the entire contents of which is incorporated herein by reference. This invention was made with contract AL-WFO2008-04 awarded from Department of Energy. This invention was made with contract W911NF-08-C-0058 awarded from the Army on behalf of DARPA. The Government has certain rights in the invention.

BACKGROUND OF THE INVENTION

1. Field of the Invention

The present invention is related to thermoelectric materials and improvements in the figure of merit of these materials. More specifically, it relates to a p-type polarity material for mid-temperature (200-500° C.) power generation.

2. Description of the Related Art

Thermoelectric (TE) materials have been among the most compelling and challenging materials studied during the last decade. Improvements in thermoelectric performance require a better understanding of how the optimal parameters can be achieved in a given system. Two promising groups of TE materials are based on GeTe and PbTe narrow-band semiconductors. GeTe is a p-type semiconductor in which the conductivity is determined by vacancies on the Ge sites. These vacancies affect not only the electric properties via generation of two holes per vacancy, but also contribute to phonon scattering with a reduction in lattice thermal conductivity. This makes GeTe a unique matrix where doping with various elements can significantly affect multiple mechanisms responsible for the thermoelectric properties.

Doping of GeTe with Ag and Sb produces a system that is typically written as $(GeTe)_y\{AgSbTe_2\}_{1-y}$, and for which the acronym "TAGS" is commonly used. For y=85%, the material is referred to as TAGS-85, and can be described by a nominal composition of $Ag_{6.52}Sb_{6.52}Ge_{36.96}Te_{50.00}$. Although TAGS-85 has been used in numerous important applications, it continues to attract interest because of the strong dependence of the carrier concentration and lattice thermal conductivity on the presence of Ge vacancies and because it has one of the highest ZT value of p-type thermoelectrics. Numerous studies have examined the effect of varying the Ag to Sb ratio, but these have not resulted in a substantial improvement in ZT. Because of the co-dependence of Seebeck coefficient and electrical conductivity on carrier concentration, increasing one generally results in a decrease of the other. One of the ways to uncouple these transport parameters is to increase the density of states near the Fermi level, as recently demonstrated by addition of Tl to PbTe.

Doping with rare earth atoms can, in principle, affect transport properties of thermoelectric materials via three mechanisms, by forming: (i) enhanced electron states near the Fermi level, (ii) local defects resulting in additional carrier scattering, and/or (iii) additional carrier scattering due to localized magnetic moments. Ce, Eu, and Yb rare-earth elements can form resonance electron states near the Fermi level and strongly affect electronic transport properties, particularly thermopower. This has been observed in binary compounds, e.g., in $CeAl_3$, $YbAl_2$, and $YbAl_3$, and in ternary compounds, e.g. in $RM_2X_2$ with R=Ce, Eu, Vb, M=Mo, Fe, Co, Ni, Cu, and X=Si, Ge. Doping of GeTe with 3d and 4f-atoms forms a dilute magnetic semiconductor (DMS), e.g. $Ge_{1-x}Mn_xTe$.

BACKGROUND DISCUSSIONS OF THESE MATERIALS CAN BE FOUND IN THE FOLLOWING LIST OF REFERENCES, THE ENTIRE CONTENTS OF EACH REFERENCE ARE INCORPORATED HEREIN BY REFERENCES

1. L. E. Bell, Science 2008, 321, 1457-1461.
2. M. S. Dresselhaus, G. Chen, M. Y. Tang, R. Yang, H. Lee, D. Wang, Z. Ren, J.-P. Fleurial, P. Gogna, Adv. Mater. 2007, 19, 1043-1053.
3. G. J. Snyder, E. S. Toberer. Nat. Mater. 2008, 7, 105-114.
4. D. H. Damon, M. S. Lubeli, R. M. Mazelsky, J. Phys. Chem. Solids 1967, 28, 520-522.
5. B. A. Cook, M. J. Kramer, X. Wei, J. L. Harringa, E. M. Levin, J. Appl. Phys. 2007, 101, 053715-1-053715-6.
6. S. H. Yang, T. J. Zhu, S. N. Zhang, J. J. Shen, X. B. Zhao, J. Electron. Mater. 2010, 39, 2127-2131.
7. J. W. Sharp, in Proc. 22nd Int. Conf. on Thermoelectrics 2003, 267-270.
8. J. P. Heremans, V. Jovovic, E. S. Toberer, A. Saramat, K. Kurosaki, A. Charoenphakdee, S. Yamanaka, G. J. Snyder, Science 2008, 321, 554-557.
9. F. Steglich, U. Rauchschwalbe, U. Gottwick, H. M. Mayer, G. Sparn, N. Grewe; U. Poppe J. J. M. Franse, J. Appl. Phys. 1985, 57, 3054-3059.
10. H. J. Van Daal, P. B. Van Aken, K. H. J. Buschow, Phys. Letters A 1974, 49A, 246-248.
11. E. M. Levin, B. S. Kuzhel, O. I. Bodak, B. D. Belan, I. N. Stets. Physica Status Solidi (b) 1990, 161, 783-795.
12. E. M. Levin, A. V. Pustovit, V. G. Sinushko, O. I. Bodak, I. N. Stets, Sov. Phys. Solid State 1992, 34(3), 454-458.
13. Y. Fukuma, H. Asada, J. Miyashita, N. Nishimura, T. Koyanagi, J. Appl. Phys. 2003, 93, 7667-7669.
14. E. M. Levin , X. W. Fang , S. L. Bud'ko , W. E. Straszheim, K. Schmidt-Rohr, Phys. Rev. B 2008 , 77 , 054418 .

SUMMARY OF THE INVENTION

In one embodiment of the invention, there is provided a thermoelectric material having a first component including a semiconductor material and a second component including a rare earth material included in the first component to thereby increase a figure of merit of a composite of the semiconductor material and the rare earth material relative to a figure of merit of the semiconductor material.

In one embodiment of the invention, there is provided a thermoelectric converter having a p-type thermoelectric material and a n-type thermoelectric material. At least one of the p-type thermoelectric material and the n-type thermoelectric material includes a rare earth material in at least one of the p-type thermoelectric material or the n-type thermoelectric material.

It is to be understood that both the foregoing general description of the invention and the following detailed description are exemplary, but are not restrictive of the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

It has been found that, in order to understand the effects of doping with magnetic atoms on thermoelectric and related properties of narrow gap semiconductors based on GeTe or PbTe, it is necessary to employ additional methods, such as measurements of the magnetic susceptibility of low magnetized materials and nuclear magnetic resonance. In this application, the effects of doping TAGS-85 with rare-earth elements are shown on the magnetic susceptibility, Te NMR spectra, Seebeck coefficient, and electrical and thermal conductivities. The rare earth family is comprised of 15 elements in the periodic table, plus scandium and yttrium. Because the chemistry of rare earth elements is largely determined by their 4f electrons which are shielded by the outermost 4d and 5p shells, the concepts herein discussed apply to all rare earth elements. The subset of Ce and Yb additions to TAGS-85 are discussed as specific examples. The enhancement of the power factor and figure of merit of TAGS-85+1% rare earth materials are described below.

Results and Discussion

Figure 1:
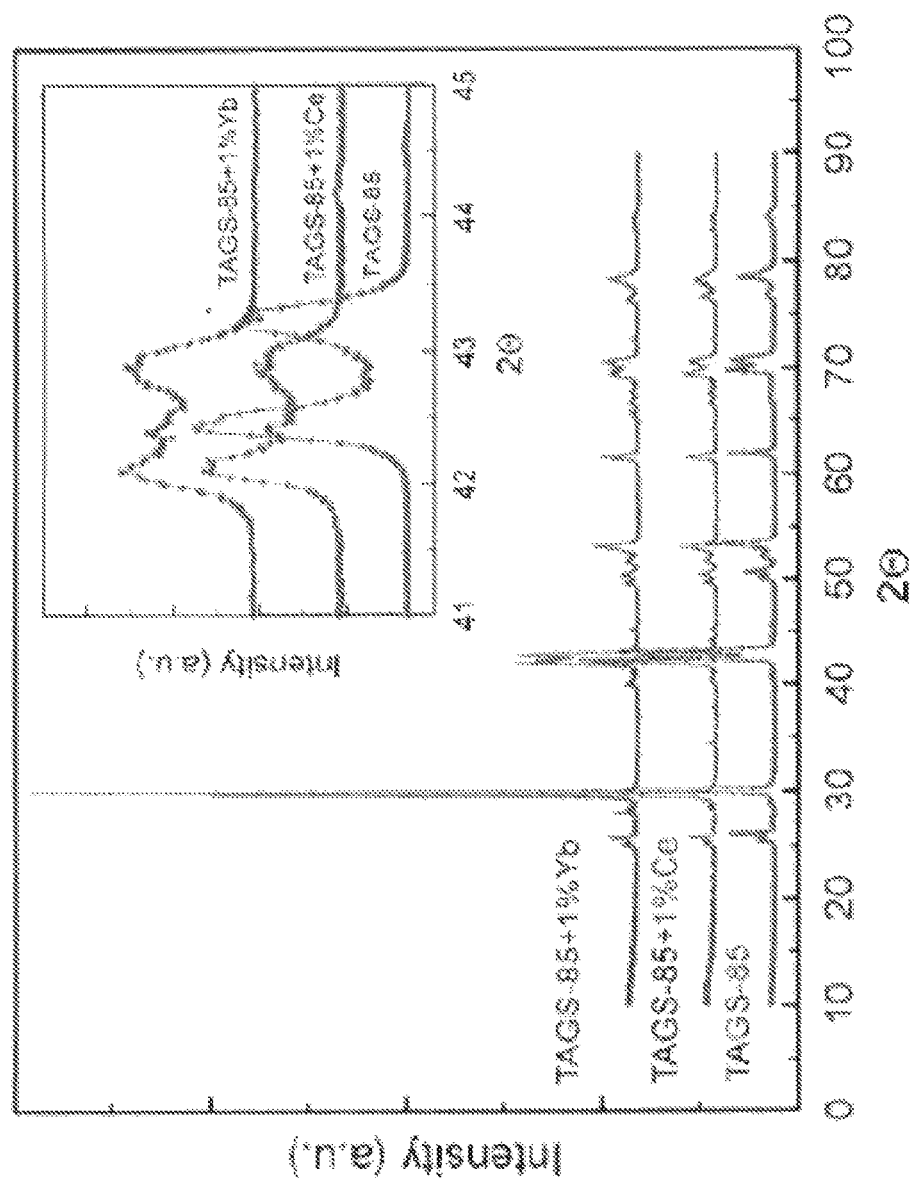
FIG. 1 is an X-ray diffraction patterns of TAGS-85, TAGS-85+1% Ce, and TAGS-85+1% Yb at 300 K.

X-ray diffraction, density, and specific heat results are described below. The initial composition of samples used in this study (see the Experimental section below) was $Ag_{6.52}Sb_{6.52}Ge_{36.96}Te_{49.00}Ce_{1.00}$ (TAGS-85+1% Ce in the following) and $Ag_{6.52}Sb_{6.52}Ge_{36.96}Te_{49.00}Yb_{1.00}$ (TAGS-85+1% Yb). FIG. 1 shows diffraction patterns of three samples: TAGS-85+1% Ce, TAGS-85+1% Yb, and neat TAGS-85 for comparison. More specifically, FIG. 1 is an X-ray diffraction patterns of TAGS-85, TAGS-85+1% Ce, and TAGS-85+1% Yb at 300 K with the inset showing an expanded view near the (220) peak for all three samples. X-ray diffraction patterns obtained on the as-solidified TAGS-85+1% Yb and TAGS-85+1% Ce were indexed to the rhombohedral R3m polymorph (space group 160), which is a slight distortion of the high-temperature cubic structure of GeTe. The rare-earth atoms did not change the structure of the GeTe matrix but the presence of minor lines in the diffraction patterns can be associated with rare earth-containing precipitate second phases. Small additional peaks at 28.10° and at 34.36° in TAGS-85+1% Ce can be attributed to $CeTe_2$ and to CeTe, those at 27.96° and 40.02° in TAGS-85+1% Yb to YbTe. The GeTe-based TAGS materials can exhibit a second-order polymorphic transformation from a low temperature rhombohedral R3m to a high-temperature cubic structure over a temperature range from 350 K to 510 K, which was demonstrated by high-temperature XRD for the (220) doublet.

The inset in FIG. 1 shows an expanded view of the (220) reflection for all three samples; the splitting of this reflection is due to an elongation of the unit cell along the [111] direction, i.e. due to rhombohedral distortion. First, note that both peaks for TAGS-85+1% Ce and TAGS-85+1% Yb are shifted by ~0.3° to smaller angles compared to those of neat TAGS-85, indicating that rare earth atoms are incorporated into the lattice. Second, the splitting of the (220) reflection in TAGS-85+1% Ce and TAGS-85+1% Yb samples is smaller than that observed for neat TAGS-85 at 300 K. The splitting for neat TAGS-85 decreases with increasing temperature due to the gradual rhombohedral to cubic transformation. This suggests that doping with Ce or Yb enhances the stability of the cubic form of TAGS-85

The density of TAGS-85+1% Ce and TAGS-85+1% Yb is slightly larger than that of neat TAGS-85 (see Table). This can be due to two reasons: (i) Ce and Yb have larger atomic masses than other elements in the samples, and (ii) doped samples contain less microcracks than neat TAGS-85. The specific heat of the doped materials is similar to that of neat TAGS-85 (see Table).

Figure 2A:
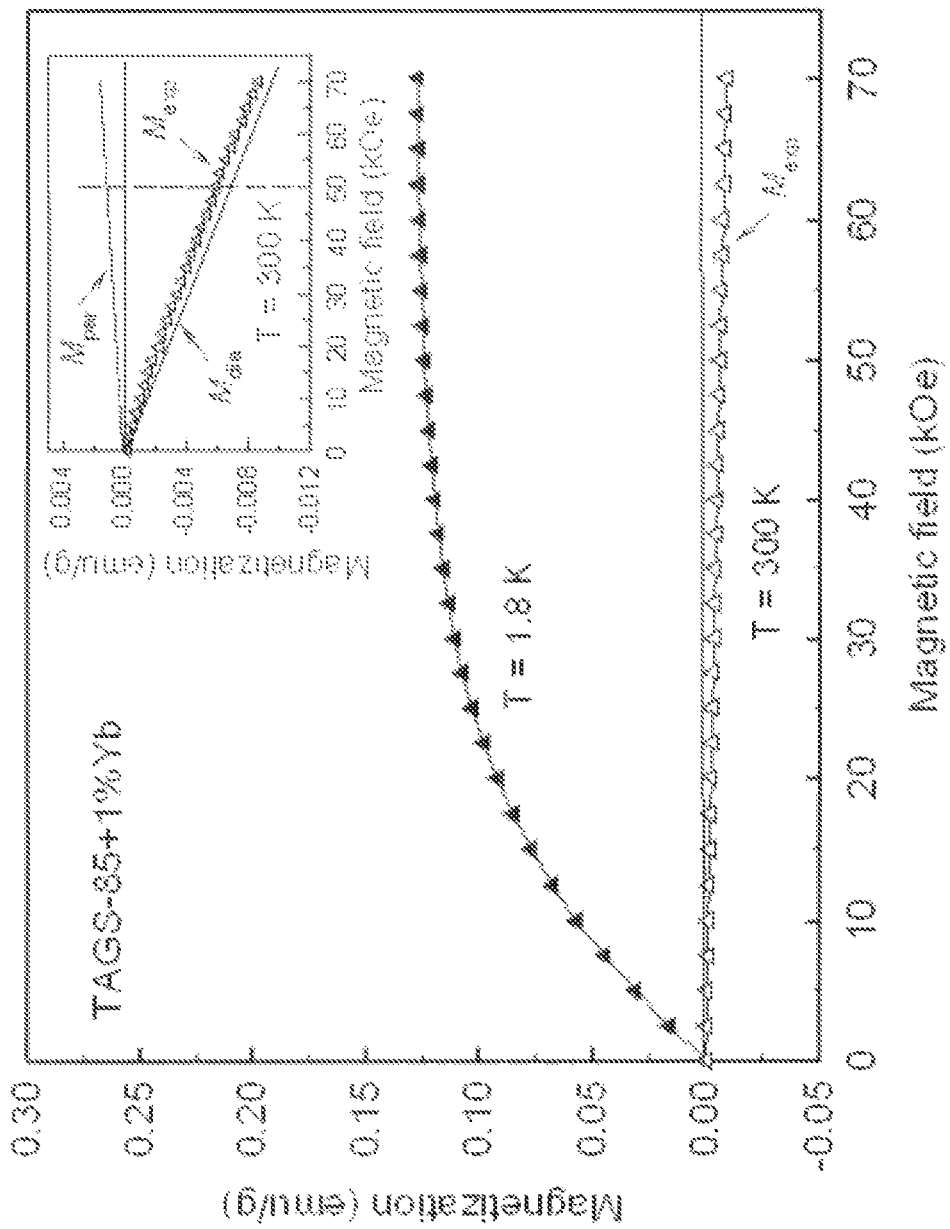
FIGS. 2(a) and 2(b) depict respectively the magnetization, $M_{exp}$, measured at 1.8 and 300 K, and (b) the temperature dependencies of the measured $(M/H)_{exp}$ ratio and calculated paramagnetic contribution $(M/H)_{par}$, of TAGS-85+1% Yb.
Figure 2B:
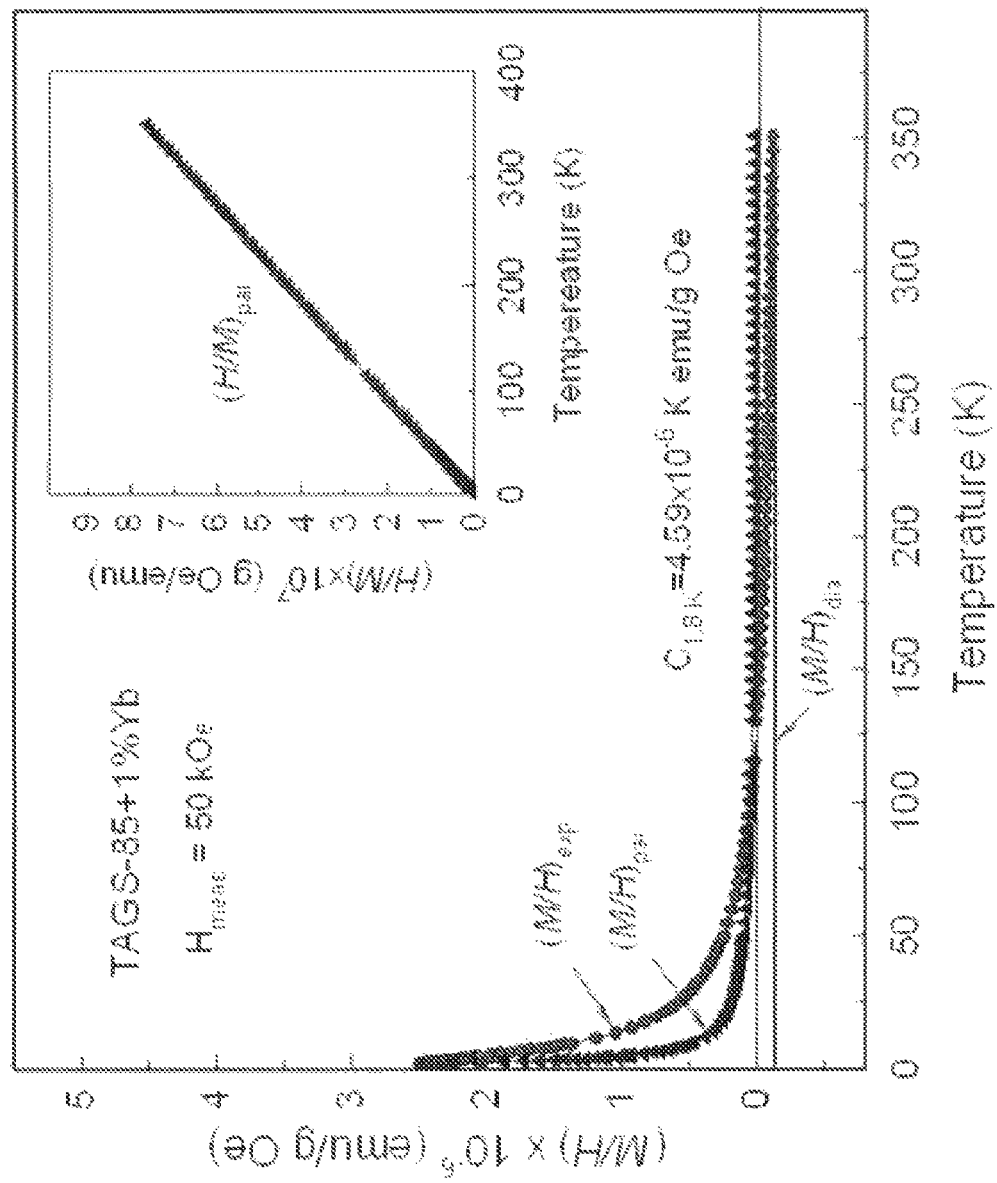

Magnetization. FIG. 2 shows plots of (a) magnetization vs. magnetic field, and (b) the M/H ratio vs. temperature for TAGS-85 doped with 1 at.% Yb. At 300 K, the sample exhibits negative (diamagnetic) mass magnetization, $M_{exp}=-5.92\times10^{-3}$ emu·g$^{-1}$, when measured in a 50 kOe magnetic field. More specifically, FIGS. 2(a) and 2(b) depict respectively the magnetization, $M_{exp}$, measured at 1.8 and 300 K, and (b) the temperature dependencies of the measured $(M/H)_{exp}$ ratio and calculated paramagnetic contribution $(M/H)_{par}$, of TAGS-85+1% Yb, with the inset in (a) showing the measured magnetization, $M_{exp}$, as well as the calculated paramagnetic, $M_{par}$, and diamagnetic, $M_{dia}$, contributions at 300 K; the inset in (b) showing the calculated $(H/M)_{par}$ ratio vs. temperature.

However, at 1.85 K, the magnetization exhibits saturated behavior which can be described by the Brillouin function. The temperature dependence of the ratio $(M/H)_{exp}=\chi_{exp}$ (where M is the measured mass magnetization of TAGS-85+1% Yb, H is the magnetic field, and $\chi_{exp}$ is the mass magnetic susceptibility) follows C/T behavior where C is the Curie constant. At 120 K, the total magnetization exhibits a transition from a predominantly paramagnetic to a predominantly diamagnetic state. Hence, the total magnetization of TAGS-85 contains two contributions, (i) diamagnetic from the PbTe:(Ag, Sb) matrix and (ii) paramagnetic from Yb atoms, i.e. $\chi_{exp} = \chi_{dia} + \chi_{par}$, wherein $\chi_{dia}$ and $\chi_{par}$ are the mass diamagnetic (negative) and paramagnetic (positive) magnetic susceptibilities, respectively.

The diamagnetic susceptibility is temperature independent while the paramagnetic one increases with decreasing temperature and can be expressed as $$\chi_{par}(mol) = (Np_{eff}^2)/3kT = C/T \quad (1)$$

where $\chi_{par(mol)} = (M_m/H)_{par} = \chi_{par} m_{mol}$ is the molar magnetic susceptibility, $m_{mol}$ is the molar mass of the formula unit of the substance, N is the Avogadro number, k is the Boltzmann constant, and $p_{eff}$ is the effective molar magnetic moment. At the lowest temperature in our study, i.e. 1.85 K, $\chi_{par} \gg \chi_{dia}$. One can use the data obtained at 1.85 K to determine the Curie constant $C = \chi_{par}(1.85 \text{ K})/T = 4.59 \times 10^{-6}$ K·emu·g$^{-1}$·Oe$^{-1}$. One can calculate $\chi_{par} = C/T$ for any temperature, e.g. at 300 K, $\chi_{par} = 0.15 \times 10^{-7}$ emu·g$^{-1}$·Oe$^{-1}$. Using this value and $\chi_{exp} = -1.07 \times 10^{-7}$ emu·g$^{-1}$·Oe$^{-1}$, we obtained $\chi_{dia} = -1.22 \times 10^{-7}$ K emu·g$^{-1}$·Oe$^{-1}$, which is in good agreement with the magnetization measurements. The inset in FIG. 2(a) shows the experimental magnetization, $M_{exp}$, and also paramagnetic, $M_{par}$, and diamagnetic, $M_{dia}$, contributions calculated from $\chi_{par}$ and $\chi_{dia} M = \chi H$. The inset in FIG. 2(b) shows the inverse $(H/M)_{par} = 1/\chi_{par}$ ratio, which fits the Curie law and indicates that Yb ions in TAGS-85 form a system of non-interacting localized magnetic moments. The chemical formula of the Yb doped sample can be written as $Ag_{6.52}Sb_{6.52}Ge_{36.96}Te_{49.00}/Yb_{1.00}$ with molar mass $m_{mol} = 212.12$ g. The effective magnetic moment per Yb atom calculated using Eq. (2) is $0.88\mu_B$, which is less than the atomic value of $4.50\mu_B$ for $Yb^{3+}$ (see discussion below).

Figure 3A:
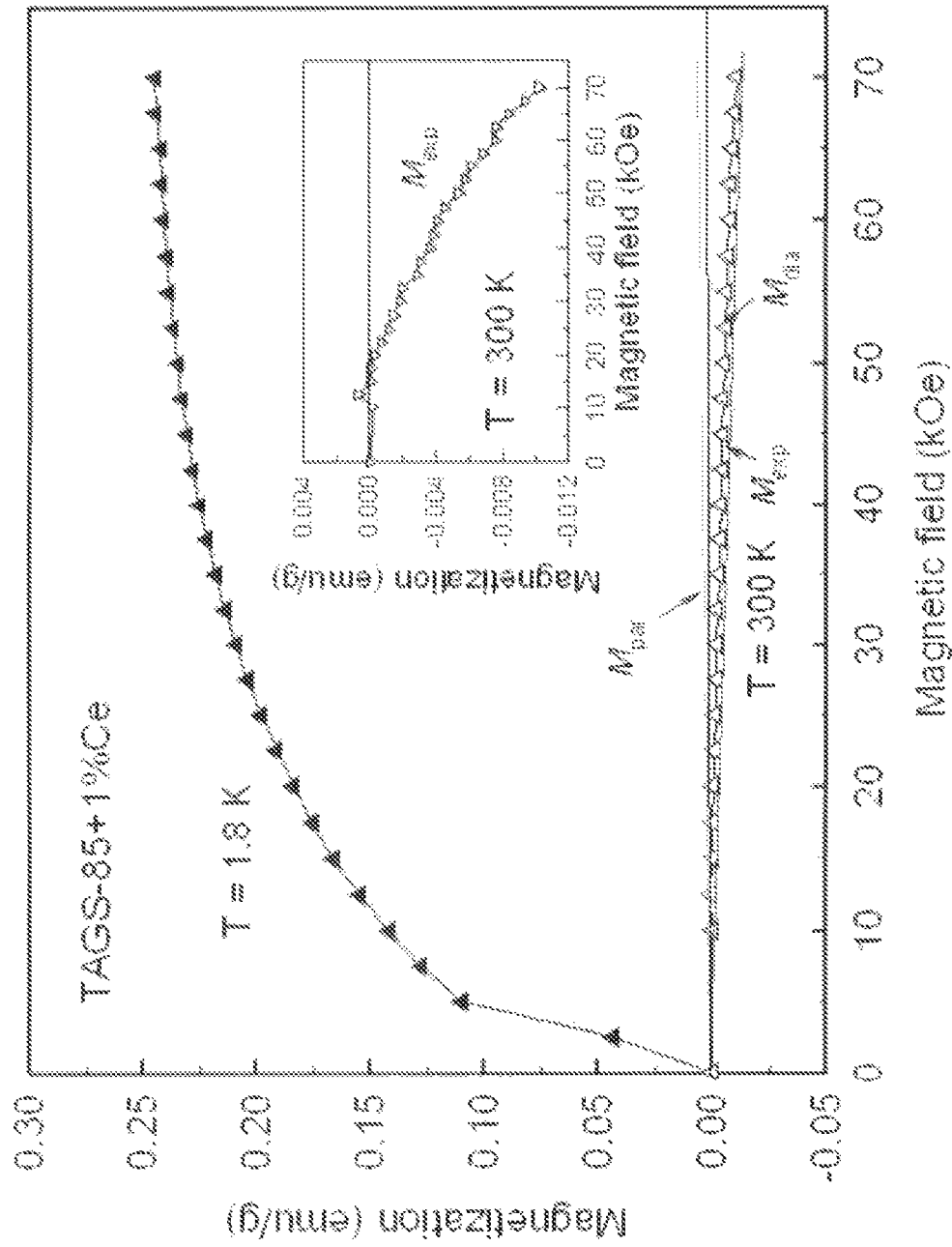
FIGS. 3(a) and 3(b) depict respectively the magnetization, $M_{exp}$, measured at 1.8 and 300 K, and (b) the temperature dependence of the measured $(H/M)_{exp}$, ratio and calculated paramagnetic contribution $(M/H)_{par}$, of TAGS-85+1% Ce.
Figure 3B:
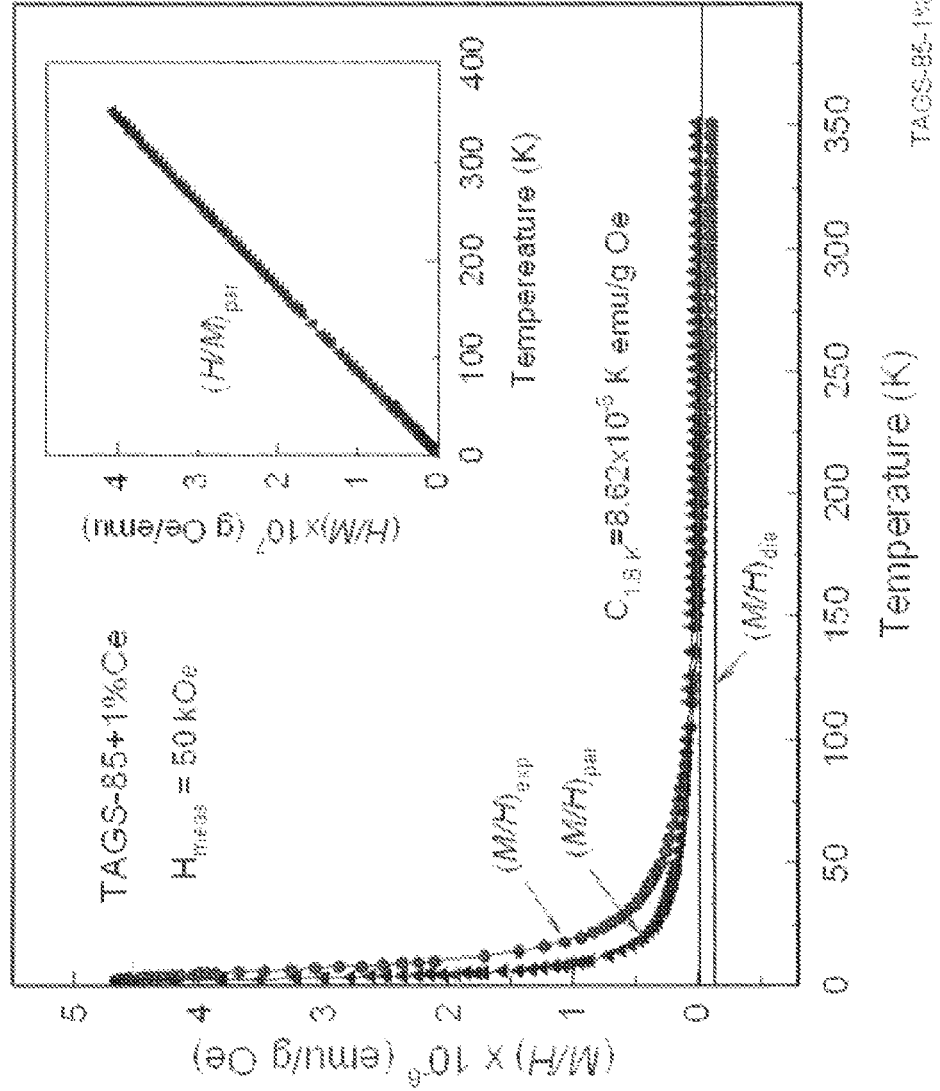

FIG. 3 shows the dependence of (a) magnetization vs. magnetic field, and (b) the M/H ratio vs. temperature for TAGS-85 doped with 1 at % Ce. More specifically, FIGS. 3(a) and 3(b) depict respectively the magnetization, $M_{exp}$, measured at 1.8 and 300 K, and (b) the temperature dependence of the measured $(H/M)_{exp}$ ratio and calculated paramagnetic contribution $(M/H)_{par}$ of TAGS-85+1% Ce, with the inset in (a) showing the measured magnetization, $M_{exp}$, and the calculated paramagnetic, $M_{par}$, contribution at 300 K and the inset in (b) showing the calculated $(H/M)_{par}$ ratio vs. temperature. Generally, the dependencies are similar to those observed for TAGS-85+1% Yb; a difference is that the magnitude of the Curie constant and paramagnetic contribution are larger, i.e. $C = \chi_{par}(1.85 \text{ K})/T = 8.62 \times 10^{-6}$ K emu·g$^{-1}$·Oe$^{-1}$ and at 300 K, $\chi_{par}$ $0.29 \times 10^{-7}$ emu·g$^{-1}$·Oe$^{-1}$. Using $\chi_{exp} = -0.81 \times 10^{-7}$ emu·g$^{-1}$·Oe$^{-1}$ at 300 K, one can determine the diamagnetic contribution $\chi_{dia} = -1.1 \times 10^{-7}$ emu·g$^{-1}$·Oe$^{-1}$ which is very close to that obtained for TAGS-85+1% Yb. Hence, at 300 K both doped samples have small paramagnetic susceptibilities whose magnitudes are even smaller than the diamagnetic susceptibility of the matrix. The chemical formula of TAGS-85+1% Ce can be written as $Ag_{6.52}Sb_{6.52}Ge_{36.96}Te_{49.00}Ce_{1.00}$ with molar mass $m_{mol} = 211.47$ g. The effective magnetic moment per Ce atom calculated using Eq. (2) is $1.21\mu_B$, which is less than the atomic value of $2.54\mu_B$ for $Ce^{3+}$ (see discussion below).

Figure 4A:
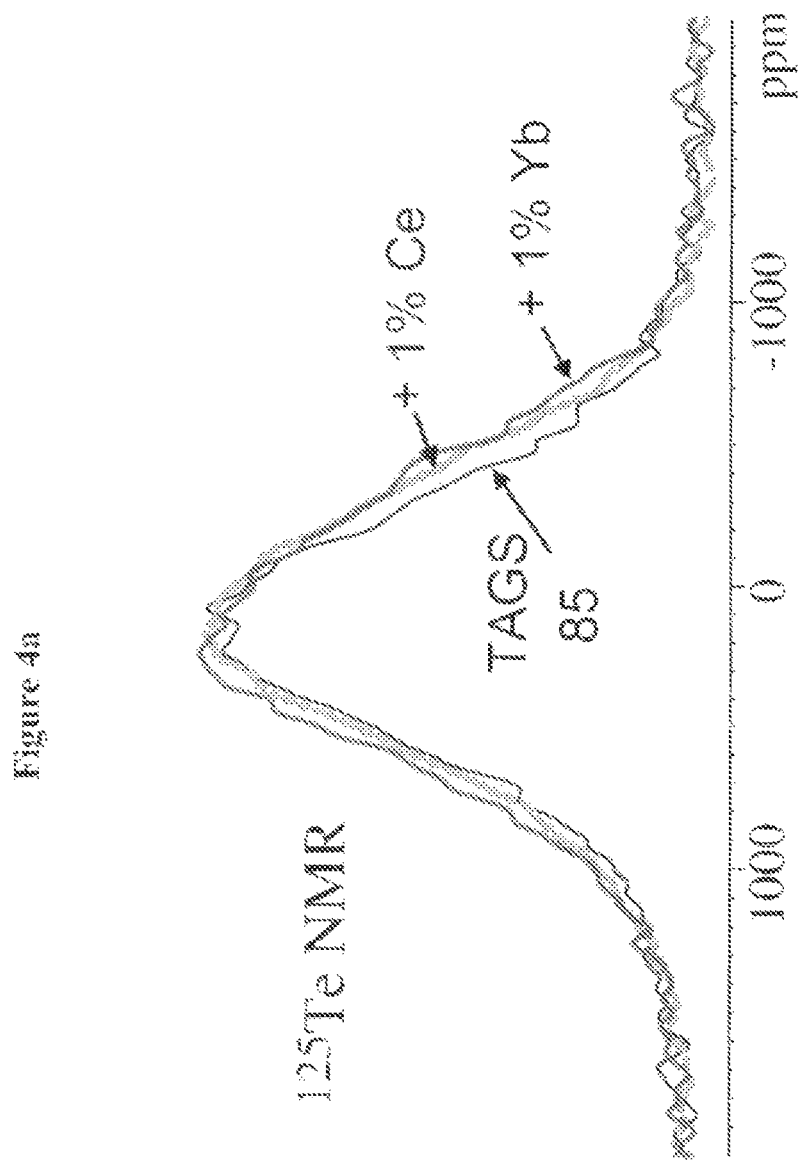
FIGS. 4(a) and 4(b) depict respectively $^{125}$Te magic-angle spinning NMR spectra of neat TAGS-85 and of TAGS-85+1% Ce and TAGS-85+1% Yb; spinning frequency: 22 kHz, recycle delay: 50 ms, and (b) normalized integral vs. delay time of the same samples, showing spin-lattice relaxation.
Figure 4B:
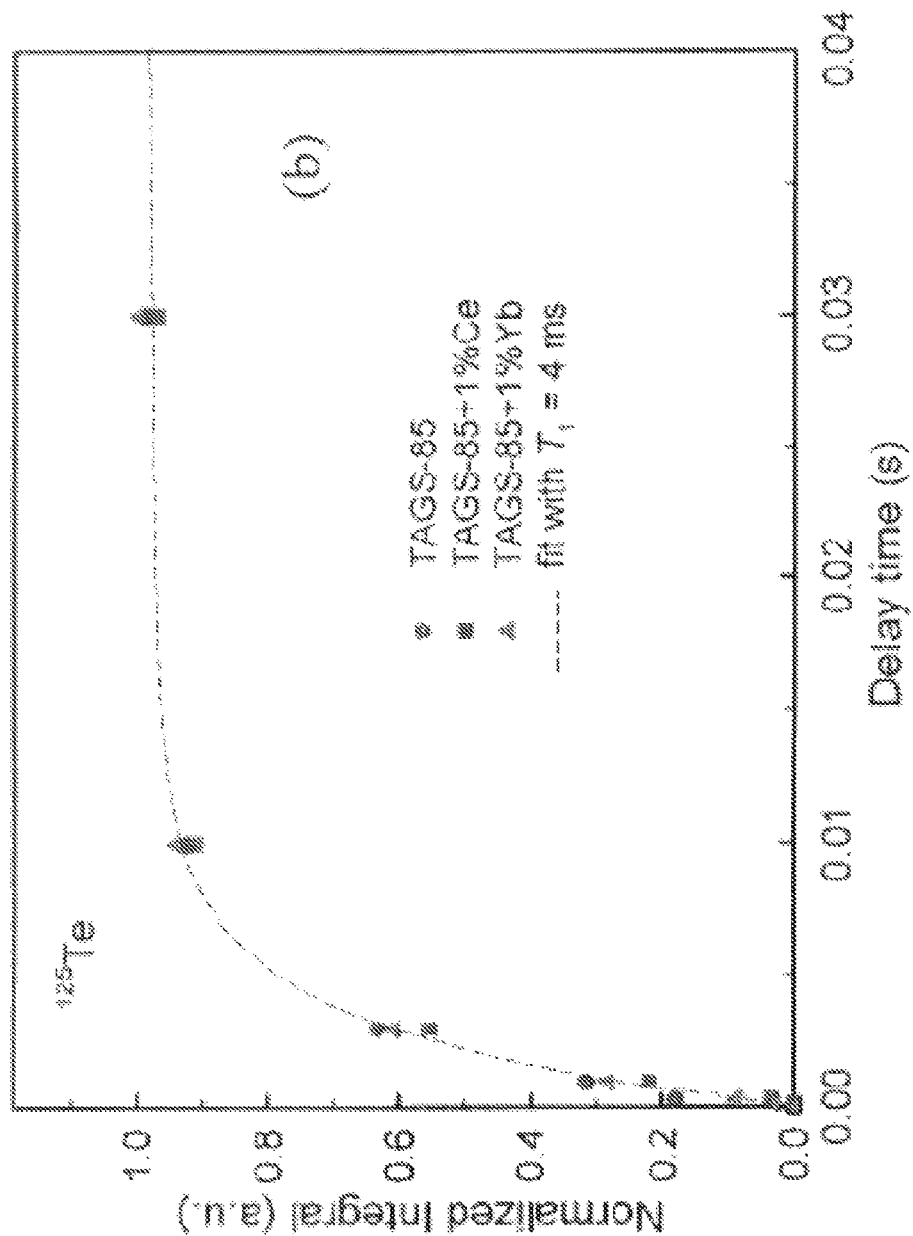

$^{125}$Te NMR spectra and relaxation measurements. FIGS. 4(a) and 4(b) show respectively $^{125}$Te NMR spectra of TAGS-85 neat and doped with 1% Ce and 1% Yb [FIG. 4(a)] and saturation recovery reflecting $^{125}$Te NMR spin-lattice relaxation [FIG. 4(b)]. More specifically, FIGS. 4(a) and 4(b) depict respectively $^{125}$Te magic-angle spinning NMR spectra of neat TAGS-85 and of TAGS-85+1% Ce and TAGS-85+1% Yb; spinning frequency: 22 kHz, recycle delay: 50 ms, and (b) normalized integral vs. delay time of the same samples, showing spin-lattice relaxation. TAGS-85 exhibits a broad NMR spectrum due to various types of disorder in the material, such as Sb and Ag dopants, vacancies on the Ge sublattice, and a distribution of Knight shifts. The magnetic fields produced by paramagnetic dopants can compromise the observability of NMR signals, but in the present materials the $^{125}$Te NMR signals remain observable after Yb and Ce doping. A slight increase in line width is observed for the doped samples, which can be attributed to paramagnetic broadening. One can measure longitudinal ($T_1$) and transverse ($T_2$) $^{125}$Te NMR relaxation times and find them to remain essentially unchanged at $T_1 \sim 4$ ms and $T_2 \sim 0.4$ ms [FIG. 4(b)]. Measurements of the apparent relaxation time $T_2^*$ due to orientation-dependent interactions (such as the chemical shift anisotropy), using recoupling under magic-angle spinning, also showed no significant change.

Figure 5A:
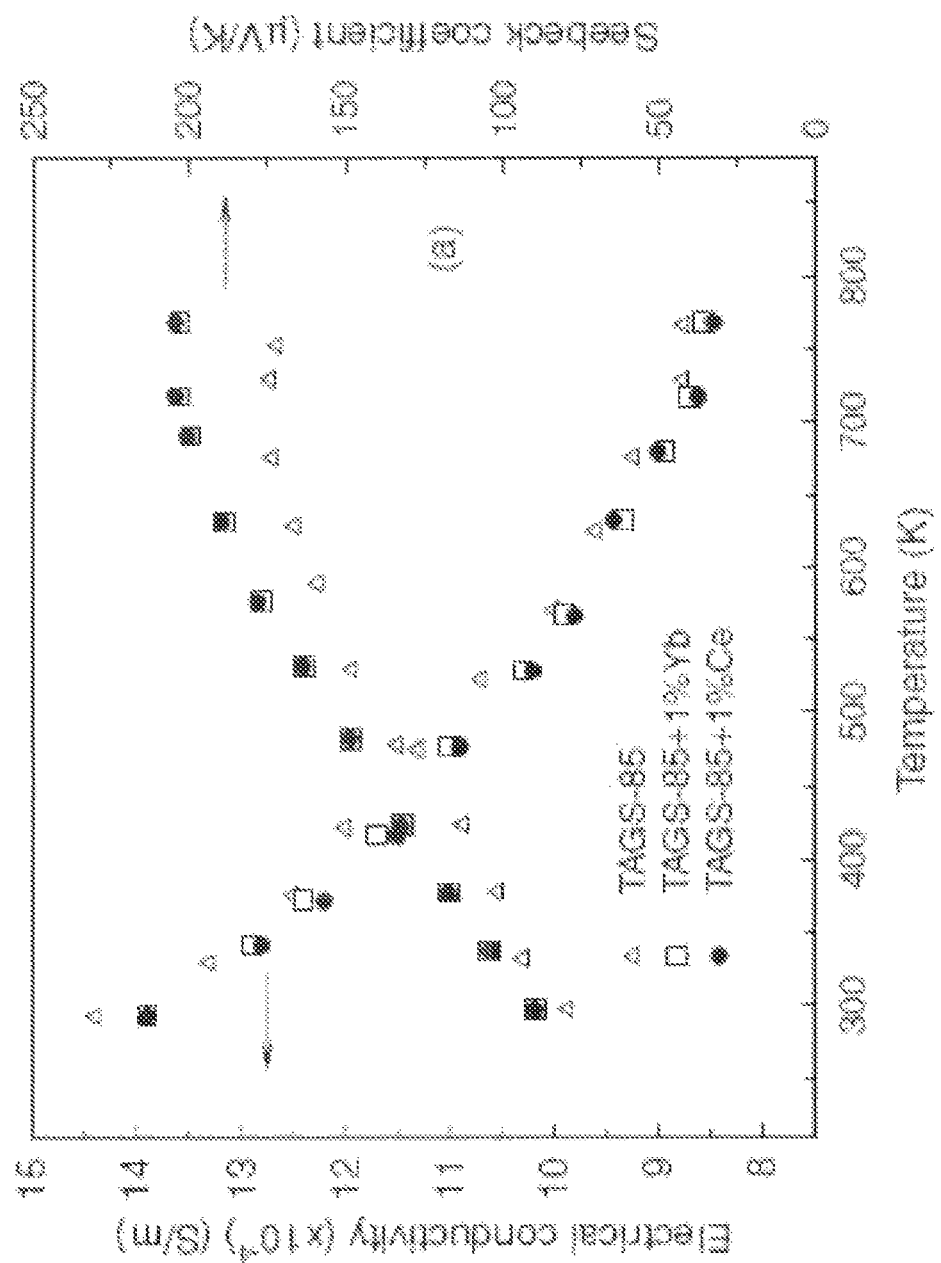
FIGS. 5(a) and 5(b) depict respectively temperature dependencies of (a) the electrical conductivity and Seebeck coefficient and (b) thermal conductivity and power factor, $S^2\sigma$, of TAGS-85, TAGS-85+1% Yb, and TAGS-85+1% Ce.
Figure 5B:
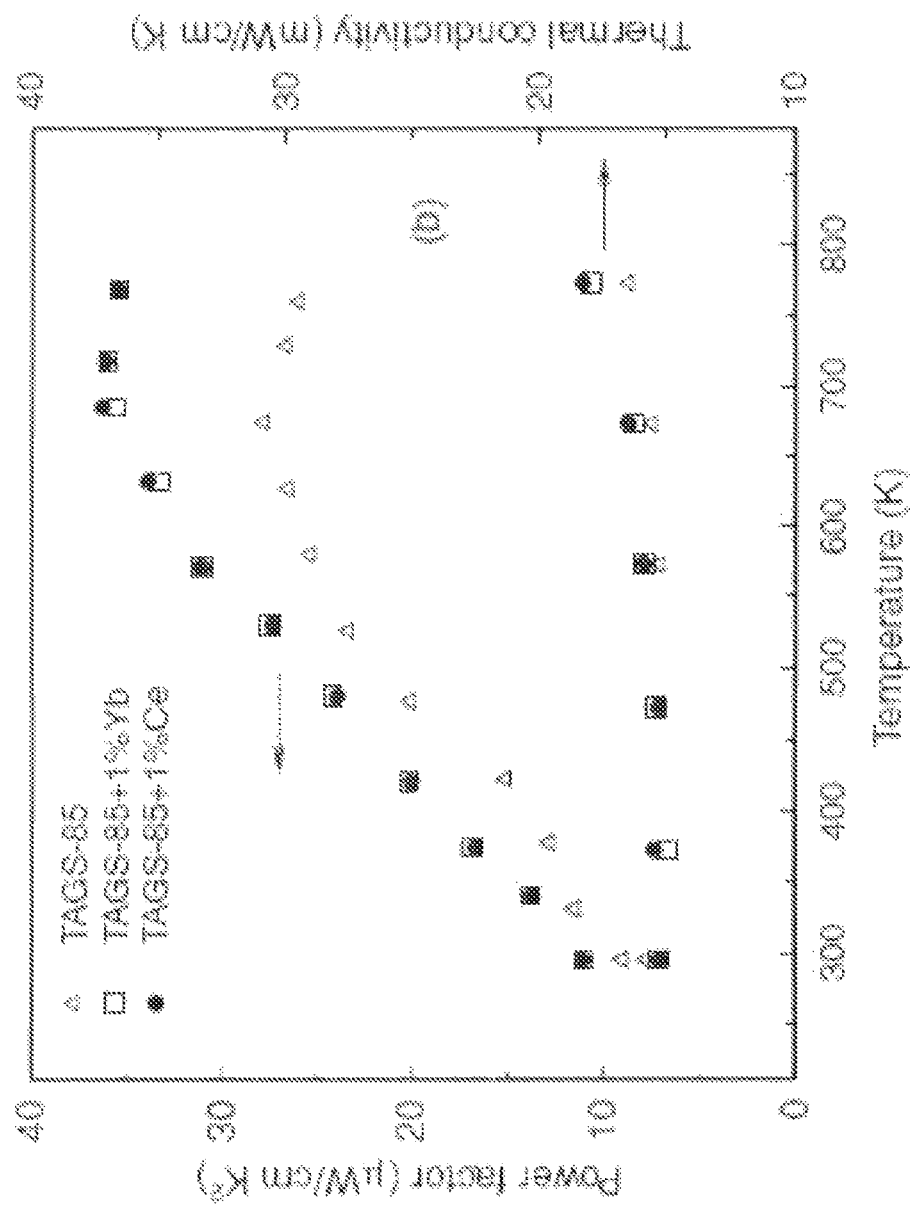

Thermopower, electrical and thermal conductivities. The temperature dependencies of the Seebeck coefficient, S, electrical conductivity, σ, and thermal conductivity, K, for two samples of TAGS-85, neat and doped with 1 at % Ce or Yb, are shown in FIGS. 5(a) and (b). More specifically, FIGS. 5(a) and 5(b) depict respectively temperature dependencies of (a) the electrical conductivity and Seebeck coefficient and (b) thermal conductivity and power factor, $S^2\sigma$, of TAGS-85, TAGS-85+1% Yb, and TAGS-85+1% Ce. Transport measurements were done on samples without visually observable microcracks. It is seen that the electrical conductivity remains essentially unchanged in the samples containing 1 at % Ce or Yb, while the Seebeck coefficient is increased by ~13% at 300 K and by ~16% at 700 K [FIG. 5(a)]. Increase in the Seebeck coefficient was confirmed by measurements made using different equipment. To estimate a possible hysteresis due to temperature cycling, one can make thermoelectric measurements of both materials on heating and cooling. For the Seebeck coefficient, the largest hysteresis (~6%) was observed at 525 K for neat TAGS-85 and the doped samples. However, the values of thermopower at the end temperatures, ~300 K and 750 K, in each cycle of measurements were very similar for all samples, i.e. the Seebeck coefficient is not changing upon thermal cycling. The electrical resistance of doped samples also shows thermal hysteresis but the values at the end temperatures after thermal cycling are again similar.

Discussion. One effect observed for TAGS-85 doped with Ce or Yb is the increase in the Seebeck coefficient at 700 K by 16%, which results in a 30% higher electrical power factor, $S^2\sigma$ [see FIG. 5(b)]. While the neat TAGS-85 at 700 K reaches a maximum power factor of 27 µW·cm$^{-1}$·K$^{-2}$, the rare earth-containing samples achieve a maximum power factor of 36 µW·cm$^{-1}$·K$^{-2}$. Note that doping TAGS-85 with Ce or Yb affects the power factor similarly.

In GeTe-based materials including TAGS-85, each vacancy on the Ge sublattice generates two holes in the valence band. Hall effect measurements have shown TAGS-85 to be a degenerate semiconductor, with a hole concentration of ~$10^{21}$ cm$^{-3}$ at 300 K. Doping of TAGS-85 with Ce or Yb clearly changes the magnetic state of the semiconductor. The Curie-type paramagnetism observed for TAGS-85+1% Ce and TAGS-85+1% Yb (see FIGS. 2 and 3) shows that the lanthanides are dispersed throughout the materials and carry localized magnetic moments.

Formation of a local magnetic moment of Ce in various environments is a complex problem. Cerium can carry a magnetic moment in the $Ce^{3+}$ state ($4f^1$) whereas it is nonmagnetic in the $Ce^{4+}$ state ($4f^0$). Similarly, ytterbium is non-magnetic in the $Yb^{2+}$ state ($4f^{14}$) and carries magnetic moment in the $Yb^{3+}$ state ($4f^{13}$). Hence, magnetic moments of Ce and Yb in TAGS-85 are associated with 4f-electrons but the values calculated from the magnetic susceptibility are smaller than those expected for $Ce^{3+}$ and $Yb^{3+}$. There are two possible explanations for this reduction: (i) Ce and Yb form very small second-phase clusters (pure Ce or Yb metals, or their tellurides) in the matrix, or (ii) due to Ce and Yb bonding with surrounding atoms their 4f-electron localization decreases. IV-VI semiconductors can be doped with lanthanides and their presence in the matrix was observed by EPR. The effects of doping PbTe and GeTe semiconductors with 3d- and 4f-elements have been described in several publications. It has been shown for single-crystalline $Pb_{1-x}M_xTe$ solid solutions that concentrations of x/2=1 to 4 at % of M Mn or Gd affect the exchange interaction and the magnetic susceptibility. A similar effect is observed in $Ge_{1-x}M_xTe$ materials with M=3d-elements.

Magnetic susceptibility measurements of $Pb_{1-x-y}Ge_xYb_yTe$ that both $Yb^{3+}$ (magnetic) and $Yb^{2+}$ (nonmagnetic) states may be present in the material simultaneously. It should be noted here that first, the presence of Ce and Yb in different valence states should be clarified by a direct method, e.g. by $L_{III}$-edge spectroscopy, and, second, some amount of the lanthanide may not be dispersed in the matrix, resulting in Ce and Yb concentrations in PbTe of less than 1 at %. However, one can conclude that doping of TAG-85 with Ce or Yb is similar to that of GeTe. XRD data and the slight increase of the NMR line width can be attributed to paramagnetic broadening due to 4f-localized magnetic moments of lanthanides located in the lattice, which is consistent with small paramagnetic contributions produced by 1% Ce or 1% Yb at 300 K.

One can estimate the paramagnetic contribution to the total magnetization of TAGS 85+1% Ce and TAGS-85+1% Yb at 300 K as $M_{par}=\chi_{par}H$, where $\chi_{par}$ is the magnetic susceptibility (see FIGS. 2 and 3 and text above) and H=9.4×10⁴ Oe is the magnetic field of the magnet used in the NMR experiments: $M_{par} < 0.003$ emu·g⁻¹. For comparison, ¹H NMR spectra exhibit large broadening or even cannot be observed if the paramagnetic contribution is ~0.5 emu·g⁻¹. Although the paramagnetic effect on the ¹H NMR spectra will be 3.5 times larger than that on ¹²⁵Te NMR spectra due to the difference in the gyromagnetic ratios of the two nuclides, the magnetic, NMR, and the thermopower data taken together indicate that Ce and Yb are incorporated in the lattice of TAGS-85 as observed for pure IV-VI semiconductors. Based on our spin-lattice ¹²⁵Te NMR relaxation data and the dependence of the spin-lattice relaxation on the carrier concentration, one can also conclude that the hole concentration in TAGS-85 doped with 1% Ce or Yb is of the same order of magnitude as that in neat TAGS-85, $10^{21}$ cm³.

Indeed, the addition of 1% Ce or 1% Yb appears to have a negligible effect on the material's electrical conductivity. In general, at temperatures above a material's Debye temperature, which is 232 K for GeTe, dilute magnetic impurities have essentially no effect on phonons. However, the thermal conductivity, κ, of TAGS-85+1% Ce and TAGS-85+1% Yb is slightly smaller at 300 K but higher by 6% at 700 K than that of neat TAGS-85. See FIG. 5(b).

The total thermal conductivity is the sum of a lattice component, $\kappa_{lat}$, due to phonon propagation, and a carrier component, $\kappa_{car}$, due to heat transported by charge carriers. The lattice component is a function of phonon scattering, which depends on a number of variables. In elemental semiconductors, the lattice component of the thermal conductivity above the Debye temperature is determined by the phonon scattering rate and generally increases with temperature as $$\kappa_{lat} \propto T^{-1} \tag{2}$$

In alloy semiconductors, there is also a point defect contribution to the phonon scattering rate, which lowers the lattice thermal conductivity by an amount proportional to the difference between the atomic mass of the $i^{th}$ atom and the average atomic mass of the alloy, estimate the effect of adding rare-earth atoms on the lattice thermal conductivity using the following equation $$\kappa_{lat} \propto T^{\frac{1}{2}} \varepsilon^{\frac{1}{2}} \tag{3}$$

where T is the absolute temperature and s is a mass-fluctuation parameter, defined as $$\varepsilon = \Sigma \frac{C_j(m_j - \bar{m})^2}{\bar{m}^2} \tag{4}$$

in which $C_j$ is the concentration of the, $j^{th}$ element of mass $m_j$, and $\bar{m}$ is the average atomic mass, given by $$\bar{m} = \Sigma C_j m_j \tag{5}$$

Using the concentrations and atomic masses in neat TAGS-85 and in TAGS-85+1% Yb, Eq. (5) predicts that addition of Yb should result in a 2.6% increase in ε relative to neat TAGS-85, while in TAGS-85+1%Ce ε is increased by 0.5%. These predictions of a slight reduction in thermal conductivity due to mass fluctuation show agreement with experimental data at ~300 K, while at temperatures above ~500 K, the opposite effect is observed: the thermal conductivity of TAGS-85 doped with rare earth is higher than that of neat TAGS-85. Indeed, while point defect scattering is generally more effective at lower temperatures where the phonon mean free path lengths tend to be large, the increase in thermal conductivity at high temperatures in the rare earth-containing compositions is curious. This phenomenon may be related to a decrease in the Grüneisen parameter by partially stabilizing the lattice or to a change in the rhombohedral to cubic phase transformation in GeTe.

Figure 6:
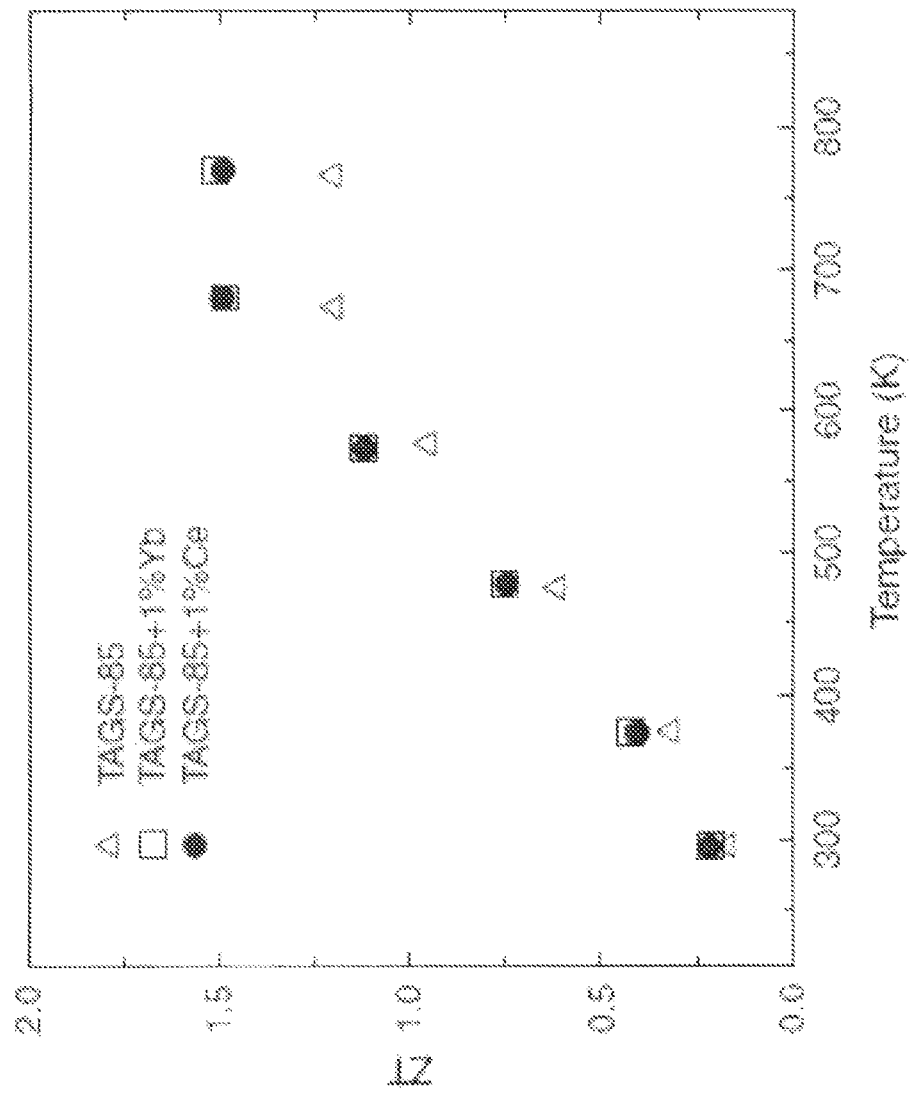
FIG. 6 is a depiction of the temperature, dependence of the figure of merit, ZT, of TAGS-85, TAGS-85+1% Yb, and TAGS-85+1% Ce.

FIG. 6 shows the temperature dependence of the figure of merit, $ZT=S^2\sigma T/\kappa$, where κ is the total thermal conductivity $\kappa=\kappa_{lat}+\kappa_{car}$, $\kappa_{lat}$ and $\kappa_{car}$ are the lattice and carrier thermal conductivities, respectively, of TAGS-85+1% Ce, TAGS-85+1% Yb, and TAGS-85 data indicate an enhancement of the thermoelectric efficiency of TAGS-85 doped with rare earth elements compared to that of neat TAGS-85. Although the thermal conductivity of TAGS-85 doped with Ce and Yb at 700 K is higher by 6% than that of neat TAGS-85, the increase in Seebeck coefficient by 16% overcomes a negative effect from the thermal conductivity and ZT reaches 1.5 (note that $ZT \propto S^2$). This is one of the highest ZT value reported for bulk p-type thermoelectrics. When steps are taken to optimize processing of the TAGS-85 with rare earth additions, even higher ZT values approaching 2 are observed.

Thermopower is sensitive to various parameters. Generally, an increase in the Seebeck coefficient can be due to (i) a decrease in carrier concentration, (ii) formation of resonance states near the Fermi level, (iii) scattering by lattice defects, and/or (iv) scattering by localized magnetic moments. The simplest explanation for the increase in thermopower is that the rare earth addition has caused a decrease in carrier concentration. Note that the electrical conductivity remained essentially unchanged, which could occur only if the mobility were to increase. However, $^{125}$Te NMR as well Hall effect measurements of samples reveal that they possess a similar carrier concentration around $10^{21}$ cm$^{-3}$ at 300 K. These measurements were performed on the actual samples, e.g., the results are not due to compositional variations within the ingots; hence, explanation (i) can be excluded. In contrast, enhancement of thermopower in TAGS-85 doped with Ce or Yb due to formation of resonance states as well as due to lattice distortion (imperfections) and magnetic scattering cannot be ruled out. The last two possible effects could be clarified by doping TAGS-85 with non-magnetic elements like La or Lu, or with Gd, which has a much larger magnetic moment of 7.55 $\mu_B$. Finally, doping of TAGS-85 with the rare-earth elements appears to enhance the stability of the cubic modification.

Doping of TAGS-85 with 1 at % rare earth generates non-interacting localized magnetic moments forming a dilute magnetic semiconductor. The localized magnetic moments are associated with the 4f$^1$- and 4f$^{13}$-shells of Ce and Yb, for example, but calculated values are less than expected for Ce$^{3+}$ and Yb$^{3+}$. This may be because not all Ce and Yb atoms are incorporated into the lattice and/or rare-earth elements, and are in states with different degrees of 4f-electron localization. While the electric conductivity of TAGS-85+1% Yb and TAGS-85+1% Ce is similar to that of TAGS-85, the Seebeck coefficient and thermal conductivity are increased by 15% and 11%, respectively. Due to the increase in the Seebeck coefficient, the power factor of TAGS-85+1% Ce and TAGS-85+1% Yb reached 36 $\mu$W·cm$^{-1}$·K$^{-2}$, which is increased by 30% compared to that of neat TAGS-85, 27 $\mu$W·cm$^{-1}$·K$^{-2}$. Although the thermal conductivity of TAGS-85+1% Ce and TAGS-85+1% Yb increases by 6%, the increase in the Seebeck effect overcomes the decrease in the thermal conductivity and the figure of merit is larger by 25%, resulting in ZT=1.5 at 700 K, which is among the highest reported for bulk p-type thermoelectrics. Taking into account that the hole concentration estimated from $^{125}$Te NMR does not depend on rare earth doping, the observed increase in Seebeck coefficient can be attributed to formation of resonance states near the Fermi level, or to carrier scattering by lattice distortions and by localized magnetic moments.

EXPERIMENTAL

Sample synthesis. TAGS-85 ingots with Ce and Yb additions were prepared by direct reaction of the constituent elements in fused silica ampoules. In addition to the stoichiometric quantities of 5N Te, Ge, Ag, and Sb, a sufficient amount of the rare earth elements was added to obtain nominal compositions of $Ag_{6.52}Sb_{6.52}Ge_{36.96}Te_{49.00}Ce_{1.00}$ and $Ag_{6.52}Sb_{6.52}Ge_{36.96}Te_{4.00}Yb_{1.00}$. The ampoules were heated up to 1223 K to fully melt the constituents, and periodically, every 15 minutes, shaken to form a homogeneous ingot upon solidification. After 3 hrs, the melts were cooled down. The solidified ingots typically contain millimeter-sized grains clearly visible to the eye. Magnetic characterization was performed on pieces sectioned from the as-solidified ingot. Transport measurements were obtained on additional samples with an average size of ~3×3×8 mm$^3$ obtained at various positions within the master ingot after cutting by a diamond saw. TAGS-85 samples doped with Ce or Yb typically contain a smaller number of visually observable cracks than does neat TAGS-85.

X-ray diffraction. Room temperature X-ray diffraction patterns were obtained on ground powders using a Scintag diffractometer with Cu-K$\alpha$ radiation of $\lambda$=1.54 Å.

Magnetic measurements. The bulk magnetic magnetization of the doped samples was measured at 1.8 and 300 K by a Quantum Design superconducting quantum interference device magnetometer in a magnetic field, H, varying from 0 to 70 kOe. The temperature dependence of the magnetic susceptibility was measured in the temperature range of 1.8-350 K in a 50-kOe magnetic field. For measurements, the samples were placed in a gel capsule of low diamagnetic susceptibility, $\chi_{dia}$=–1.3×10$^{-8}$ emu·g$^{-1}$·Oe$^{-1}$ which is an order of magnitude smaller than the lowest magnetic susceptibility of the samples. The uncertainties of the magnetic measurements were less than 2%.

Nuclear Magnetic Resonance (NMR). Solid-state $^{125}$Te NMR experiments were run on a Bruker Biospin (Billerica, Mass.) DSX-400 spectrometer (magnetic field of 9.3900 T) at 126 MHz, using a 2.5-mm magic-angle spinning probe head at 22 kHz spinning frequency; sample masses were ~30 mg. Signals were detected after a Hahn echo generated by a 2 $\mu$s-t$_r$-3.8$\mu$s-t$_r$, two-pulse sequence, where t$_r$ denotes a rotation period. The second pulse and receiver phase were cycled according to the EXORCYCLE scheme. Measuring times were around 10 h for each spectrum. $^{125}$Te NMR chemical shifts were referenced to Te(OH)$_6$ in solution, via solid TeO$_2$ at +750 ppm as a secondary reference.

Thermopower, electrical and thermal conductivities, and Hall effect. Transport properties of TAGS-85 samples were measured on the samples without visually observable microcracks. The high temperature electrical resistivity measurements were performed by a standard dc four-point probe technique in, a vacuum chamber (~10$^{-7}$ torr) within the temperature range of 298 K to 773 K by an automated data acquisition system. Seebeck coefficient and resistivity were measured simultaneously on the same sample. During the resistivity measurement, current to heaters positioned on either end of the sample was individually adjusted to produce a temperature difference of 5 K to 10 K. The Seebeck coefficient was measured relative to the Pt legs of the thermocouple. The total thermal conductivity, $\kappa$=$\kappa_{lat}$+$\kappa_{car}$, where $\kappa_{lat}$ and $\kappa_{car}$ are the lattice and carrier thermal conductivities, respectively, was determined by the measurement of three parameters, thermal diffusivity, $\alpha$, specific heat capacity, $C_p$, and sample density, d, as $$\kappa = \alpha C_p d \qquad (1)$$

Thermal diffusivity, $\alpha$, is determined using the laser flash diffusivity method, in which the front surface of a thin disk is irradiated by a 1-ms laser pulse in vacuum. An infrared detector records the resulting temperature profile of the back surface.

Measurements of density and specific heat capacity. The sample density, d, was measured by the Archimedes method. The specific heat capacity, $C_p$, was measured with a Perkin-Elmer DSC-4 Differential Scanning calorimeter. The Hall effect was measured in a 1-T magnetic field at 300 K. The uncertainties of thermopower, electrical and thermal conductivities, and carrier concentration from Hall effect are 5, 2, 5, and 10%, respectively.

TABLE

Density and specific heat capacity of TAGS-85 + 1% Ce,
TAGS-85 + 1% Yb, and TAGS-85 at 296 K.

| Composition | Density (g · cm$^{-3}$) | Specific heat capacity (J · g$^{-1}$ · K$^{-1}$) |
|---|---|---|
| TAGS-85 + 1% Ce | 6.145 | 0.259 |
| TAGS-85 + 1% Yb | 6.225 | 0.259 |
| TAGS-85 | 6.113 | 0.260 |

Results

Doping of TAGS-85 with 1 at % Ce or Yb forms a dilute magnetic semiconductor system with non-interacting localized magnetic moments that obey the Curie law. X-ray diffraction patterns and slight broadening in $^{125}$Te NMR, attributed to paramagnetic effects, suggest that Ce and Yb atoms are incorporated into the lattice. $^{125}$Te NMR spin-lattice relaxation and Hall effect show similar hole concentrations of ~10$^{21}$ cm$^{-3}$. At 700 K, the electric conductivity of the Ce- and Yb-doped samples is similar to that of neat TAGS-85, while the thermal conductivity and the Seebeck coefficient are larger by 6% and 16%, respectively. Possible mechanisms responsible for the observed increase in thermopower may include (i) formation of resonance states near the Fermi level and (ii) carrier scattering by lattice distortion and/or by paramagnetic ions. Due to the increase in the Seebeck coefficient up to 205 µV·K$^{-1}$, the thermoelectric power factor of Ce- and Yb-doped samples reaches 36 µW·cm$^{-1}$·K$^{-2}$, which is larger than that measured for neat TAGS-85, 27 µW·cm$^{-1}$·K$^{-2}$. The increase in the Seebeck coefficient overcomes the increase in the thermal conductivity, resulting in a total increase of the figure of merit by –25% at 700 K compared to that observed for neat TAGS-85.

Mid-Temperature Nano-Bulk Materials

In one embodiment of the invention, mid-temperature (100-300° C.) nano-bulk materials referred to as TAGS may be hot-pressed and heat treated to form billets or other nano-bulk composites. Such materials, according to the invention, could then be utilized for bulk or thin film type thermoelectric devices. More specifically, PbTe alloys (or the other alloys described herein) can be prepared to induce formation of ultrafine precipitates through a process known as spinodal decomposition. Several additives are insoluble with PbTe, including GeTe, SnTe, and MnTe. Through a systematic processing of these additives, combined with various processing methods such as solidification rate and heat treatment, nanostructured PbTe alloys containing a uniform distribution of thermally stable second phase inclusions is expected. These other materials, according to the invention, could then be utilized for bulk or thin film type thermoelectric devices.

Aspects of the Invention

In one aspect of the invention, there is provided a thermoelectric material comprising a first component including a semiconductor material; and a second component including a rare earth material included in the first component. The inclusion of the rare earth material in the semiconductor material increases a figure of merit of a composite of the semiconductor material and the rare earth material relative to a figure of merit of the semiconductor material.

In this aspect of the invention, the semiconductor material can be a GeTe-based alloy which includes the rare earth material. The rare earth material can include at least one of La, Ce, Pr, Nd, Sm, Eu, Gd, Tb, Dy, Ho, Er, Tm, Yb, Lu, or an alloy or combination thereof The rare earth material can have a concentration of 0.1% to 25%. The GeTe alloy can include at least one of Ag and Sb, and more specifically can be $(GeTe)_y\{AgSbTe_2\}_{1-y}$, and $Ag_{6.52}Sb_{6.52}Ge_{36.96}Te_{49.00}Ce_{1.00}$ or $Ag_{6.52}Sb_{6.52}Ge_{36.96}Te_{49.00}Yb_{1.00}$, or $Ag_{6.52}Sb_{6.52}Ge_{36.96}Te_{49.00}Gd_{1.00}$.

In this aspect of the invention, the semiconductor material can be a PbTe-based alloy which includes the rare earth material. The rare earth material can include at least one of La, Ce, Pr, Nd, Sm, Eu, Gd, Tb, Dy, Ho, Er, Tm, Yb, Lu, or an alloy thereof The rare earth material can have a concentration of 0.1% to 25%. The PbTe alloy can include at least one of Ag and Sb, and more specifically can be $(PbTe)_y\{AgSbTe_2\}_{1-y}$, and $Ag_{6.52}Sb_{6.52}Pb_{36.96}Te_{49.00}Ce_{1.00}$ or $Ag_{6.52}Sb_{6.52}Pb_{36.96}Te_{49.00}Yb_{1.00}$, or $Ag_{6.52}Sb_{6.52}Pb_{36.96}Te_{49.00}Gd_{1.00}$.

In one aspect of the invention, there is provided a thermoelectric converter having a p-type thermoelectric material and a n-type thermoelectric material. At least one of the p-type thermoelectric material and the n-type thermoelectric material includes a rare earth material in at least one of the p-type thermoelectric material or the n-type thermoelectric material.

In this aspect of the invention, the rare earth material can scatter electrical carriers in at least one of the p-type thermoelectric material or the n-type thermoelectric material. The p-type thermoelectric material and the n-type thermoelectric material can be a GeTe alloy, a PbTe alloy, or a combination thereof.

In this aspect of the invention, the p-type thermoelectric material and the n-type thermoelectric material can operate as thermoelectrics in a temperature range of 300K to 1300K or in a temperature range of 100K to 300K.

In this aspect of the invention, the rare earth material and nanostructured elements in at least one of the p-type thermoelectric material or the n-type thermoelectric material can reduce a lattice thermal conductivity of at least one of the p-type thermoelectric material or the n-type thermoelectric material by phonon scattering in the p-type thermoelectric material or the n-type thermoelectric material. See e.g., Venkatasubramanian et al., Nature, Vol. 413, page 597-602, 2001 (the entire contents of which are incorporated herein by reference) for a description of nanostructured elements in thermoelectric materials and the effect thereof to reduce lattice thermal conductivity.

In this aspect of the invention, the rare earth material can produce scattering of electrical carriers in at least one of the p-type thermoelectric material or the n-type thermoelectric material and can increase a density of states for the carriers by quantum confinement. See e.g., Hicks et al., Phys. Rev. B 47, page 12727-12731, 1993 (the entire contents of which are incorporated herein by reference) for a description of scattering of electrical carriers in thermoelectric materials and the effect thereof to increase a density of states for the carriers by quantum confinement.

In this aspect of the invention, the rare earth material can produce scattering of electrical carriers in at least one of the p-type thermoelectric material or the n-type thermoelectric material to provide resonant states for the carriers in the p-type thermoelectric material or the n-type thermoelectric material to increase a Seebeck coefficient of the p-type thermoelectric material or the n-type thermoelectric material. See e.g., Heremans et al., Science, Vol. 321, page 554-557, 2008 (the entire contents of which are incorporated herein by reference) for a description of resonant states for the carriers in thermoelectric materials and the effect thereof to increase a Seebeck coefficient.

In this aspect of the invention, the rare earth material and nano structured elements in at least one of the p-type thermoelectric material or the n-type thermoelectric material can reduce at least one of lattice thermal conductivity, quantum confinement, and resonant states in the p-type thermoelectric material or the n-type thermoelectric material.

In one aspect of the invention, there is provided a method for enhancing a ZT figure of merit in a semiconductor material. The method provides in the semiconductor material a rare earth material which magnetically scatters electrical carriers in the semiconductor material. In this aspect of the invention, the magnetic material can be at least one of Ce, Yb, Gd, or an alloy thereof.

Numerous modifications and variations of the present invention are possible in light of the above teachings. It is therefore to be understood that within the scope of the appended claims, the invention may be practiced otherwise than as specifically described herein.

The invention claimed is:

1. A thermoelectric material comprising:
a first component including a semiconductor material; and
a second component including rare earth material magnetic precipitates included in the first component; and
said first component and said second component having respectively diamagnetic and paramagnetic magnetic susceptibilities to thereby increase a figure of merit of a composite of the semiconductor thermoelectric material and the rare earth material precipitates elative to a figure of merit of the semiconductor material.

2. The thermoelectric material of claim 1, wherein the semiconductor material comprises a GeTe alloy, and said GeTe alloy includes the rare earth material precipitates.

3. The thermoelectric material of claim 2, where the rare earth material precipitates includes at least one of La, Ce, Pr, Nd, Sm, Eu, Gd, Tb, Dy, Ho, Er, Tm, Yb, Lu, or an alloy thereof.

4. The thermoelectric material of claim 2, where the rare earth material precipitates comprises a concentration of 0.1% to 25%.

5. The thermoelectric material of claim 2, where the GeTe alloy includes at least one of Ag and Sb.

6. The thermoelectric material of Claim 2, where the GeTe alloy comprises $(GeTe)_y(AgSbTe_2)_{1-y}$.

7. The thermoelectric material of claim 2, where the GeTe alloy comprises $Ag_{6.52}Sb_{6.52}Ge_{36.96}Te_{49.00}Ce_{1.00}$.

8. The thermoelectric material of claim 2, where the GeTe alloy comprises $Ag_{6.52}Sb_{6.52}Ge_{36.96}Te_{49.00}Yb_{1.00}$.

9. The thermoelectric material of claim 2, where the GeTe alloy comprises $Ag_{6.52}Sb_{6.52}Ge_{36.96}Te_{49.00}Gd_{1.00}$.

10. The thermoelectric material of claim 1, wherein the semiconductor material comprises a PbTe alloy, and said PbTe alloy includes the rare earth material precipitates.

11. The thermoelectric material of claim 10, where the rare earth material precipitates includes at least one of La, Ce, Pr, Nd, Sm, Eu, Gd, Tb, Dy, Ho, Er, Tm, Yb, Lu, or an alloy thereof.

12. The thermoelectric material of claim 10, where the rare earth material precipitates comprises a concentration of 0.1% to 25%.

13. The thermoelectric material of claim 10, where the PbTe alloy includes at least one of Ag and Sb.

14. The thermoelectric material of claim 10, where the PbTe alloy comprises $(PbTe)_y(AgSbTe_2)_{1-y}$.

15. The thermoelectric material of claim 10, where the PbTe alloy comprises $Ag_{6.52}Sb_{6.52}Pb_{36.96}Te_{49.00}Ce_{1.00}$.

16. The thermoelectric material of claim 10, where the PbTe alloy comprises $Ag_{6.52}Sb_{6.52}Pb_{36.96}Te_{49.00}Yb_{1.00}$.

17. The thermoelectric material of claim 10, where the PbTe alloy comprises $Ag_{6.52}Sb_{6.52}Pb_{36.96}Te_{49.00}Gd_{1.00}$.

18. A thermoelectric converter comprising the thermoelectric material of claim 1 including:
a p-type thermoelectric material and a n-type thermoelectric material,
at least one of the p-type thermoelectric material and the n-type thermoelectric material including a rare earth material in at least one of the p-type thermoelectric material or the n-type thermoelectric material.

19. The converter of claim 18, wherein the rare earth material scatters electrical carriers in at least one of the p-type thermoelectric material or the n-type thermoelectric material.

20. The converter of claim 18, wherein at least one of the p-type thermoelectric material and the n-type thermoelectric material comprises a GeTe alloy.

21. The converter of claim 18, wherein at least one of the p-type thermoelectric material and the n-type thermoelectric material comprises a PbTe alloy.

22. The converter of claim 18, wherein the p-type thermoelectric material and the n-type thermoelectric material operate as thermoelectrics in a temperature range of 300K to 1300K.

23. The converter of claim 18, wherein the p-type thermoelectric material and the n-type thermoelectric material operate as thermoelectrics in a temperature range of 100K to 300K.

24. The converter of claim 18, wherein the rare earth material and nanostructured elements in at least one of the p-type thermoelectric material or the n-type thermoelectric material reduce a lattice thermal conductivity of at least one of the p-type thermoelectric material or the n-type thermoelectric material by phonon scattering in the p-type thermoelectric material or the n-type thermoelectric material.

25. The converter of claim 18, wherein the rare earth material produces scattering of electrical carriers in at least one of the p-type thermoelectric material or the n-type thermoelectric material and increases a density of states for the carriers by quantum confinement.

26. The converter of claim 18, wherein the rare earth material produces scattering of electrical carriers in at least one of the p-type thermoelectric material or the n-type thermoelectric material to provide resonant states for the carriers in the p-type thermoelectric material or the n-type thermoelectric material to increase a Seebeck coefficient of the p-type thermoelectric material or the n-type thermoelectric material.

27. The converter of claim 18, wherein the rare earth material and nanostructured elements in at least one of the p-type thermoelectric material or the n-type thermoelectric material reduce to reduce at least one of lattice thermal conductivity, quantum confinement, and resonant states in the p-type thermoelectric material or the n-type thermoelectric material.

28. A method for enhancing a ZT figure of merit in a semiconductor material, comprising:
   providing in the semiconductor material rare earth material precipitates which scatters electrical carriers in the semiconductor material, said semiconductor material with the rare earth material precipitates having diamagnetic and paramagnetic magnetic susceptibilities.

29. The method of claim 28, wherein providing comprises:
   providing at least one of La, Ce, Pr, Nd, Sm, Eu, Gd, Tb, Dy, Ho, Er, Tm, Yb, Lu, or an alloy thereof as the rare earth material precipitates.

* * * * *

UNITED STATES PATENT AND TRADEMARK OFFICE
CERTIFICATE OF CORRECTION

PATENT NO. : 9,437,796 B2
APPLICATION NO. : 13/725156
DATED : September 6, 2016
INVENTOR(S) : Rama Venkatasubramanian et al.

It is certified that error appears in the above-identified patent and that said Letters Patent is hereby corrected as shown below:

In the Claims

Column 13, Line 37, Claim 1 change "elative" to --relative--

Signed and Sealed this
Sixth Day of March, 2018

Andrei Iancu
*Director of the United States Patent and Trademark Office*